United States Patent
Kretz et al.

(10) Patent No.: US 8,040,299 B2
(45) Date of Patent: Oct. 18, 2011

(54) ACTIVE MATRIX OF AN ORGANIC LIGHT-EMITTING DIODE DISPLAY SCREEN

(75) Inventors: Thierry Kretz, Saint Jean de Moirans (FR); Hugues Lebrun, Coublevie (FR); Elisabeth Chuiton, Revel (FR)

(73) Assignee: Thales, Neuilly sur Seine (FR)

( * ) Notice: Subject to any disclaimer, the term of this patent is extended or adjusted under 35 U.S.C. 154(b) by 793 days.

(21) Appl. No.: 12/049,747

(22) Filed: Mar. 17, 2008

(65) Prior Publication Data

US 2008/0231556 A1    Sep. 25, 2008

(30) Foreign Application Priority Data

Mar. 16, 2007  (FR) ...................................... 07 01929

(51) Int. Cl.
  *G09G 3/30* (2006.01)
  *G09G 3/10* (2006.01)
(52) U.S. Cl. ............ 345/76; 345/82; 345/204; 313/463; 315/169.3
(58) Field of Classification Search .............. 345/73–86, 345/204; 315/169.1–169.4, 169.3; 313/463
  See application file for complete search history.

(56) References Cited

U.S. PATENT DOCUMENTS

| | | | |
|---|---|---|---|
| 6,359,608 B1 | 3/2002 | Lebrun et al. | |
| 6,611,311 B1 | 8/2003 | Kretz et al. | |
| 6,924,785 B1 | 8/2005 | Kretz et al. | |
| 6,972,747 B2 | 12/2005 | Bayot et al. | |
| 6,977,638 B1 | 12/2005 | Bayot et al. | |
| 7,189,496 B2 | 3/2007 | Saluel et al. | |
| 7,199,396 B2 | 4/2007 | Lebrun | |
| 7,425,937 B2 * | 9/2008 | Inukai .............................. | 345/76 |
| 2004/0066146 A1 * | 4/2004 | Park et al. .................. | 315/169.3 |
| 2004/0164303 A1 | 8/2004 | Anzai | |
| 2006/0082716 A1 | 4/2006 | Lebrun et al. | |
| 2006/0146209 A1 | 7/2006 | Kretz et al. | |
| 2007/0252780 A1 | 11/2007 | Lebrun | |

OTHER PUBLICATIONS

U.S. Appl. No. 11/997,679, filed Feb. 1, 2008, Hugues Lebrun, et al.
U.S. Appl. No. 12/063,359, filed Feb. 8, 2008, Hughes Lebrun, et al.
U.S. Appl. No. 12/066,327, filed Mar. 10, 2008, Thierry Kretz.

* cited by examiner

*Primary Examiner* — Lun-Yi Lao
*Assistant Examiner* — Sosina Abebe
(74) *Attorney, Agent, or Firm* — Oblon, Spivak, McClelland, Maier & Neustadt, L.L.P.

(57) ABSTRACT

An active matrix for an organic light-emitting diode display screen, including: pixels arranged in rows and in columns, each pixel including, a pixel electrode capable of accommodating an organic light-emitting diode on the surface, and first and second current drivers connected to said pixel electrode, wherein the first and second current drivers each include a current control transistor connected between a supply voltage Vdd and said pixel electrode and at least a first switching transistor that controls a gate of said current control transistor.

10 Claims, 10 Drawing Sheets

ACTIVE MATRIX OF AN ORGANIC LIGHT-EMITTING DIODE DISPLAY SCREEN

The present invention relates to an active matrix for an organic light-emitting diode display screen, or AMOLED (Active Matrix Organic Light-Emitting Diode) matrix and more particularly to an arrangement of the pixels in such a matrix.

In an organic light-emitting diode display screen, the pixel is a structure based on an organic light-emitting diode. Such a display screen does not require an additional light source, unlike other display devices such as LCD (Liquid Crystal Display) devices. It has, as other advantages, a low power consumption, a high brightness and low manufacturing cost. The principle at the basis of the display of video data by OLED diodes is the modulation of the diode current. This is obtained by a current control transistor that receives, on its gate, a voltage corresponding to the video data to be displayed and delivers a corresponding current to the diode. In practice, the display screen thus consists of two substrates, typically one made of glass that supports an active matrix with the current drivers and pixel electrodes, an organic light-emitting diode being formed on each pixel electrode, between each pixel electrode and a reference voltage plane, and the other substrate, also made of glass, sealing the zone containing the light-emitting diodes and their electrodes by isolating them from water and air.

BACKGROUND OF THE INVENTION

Figure 1:
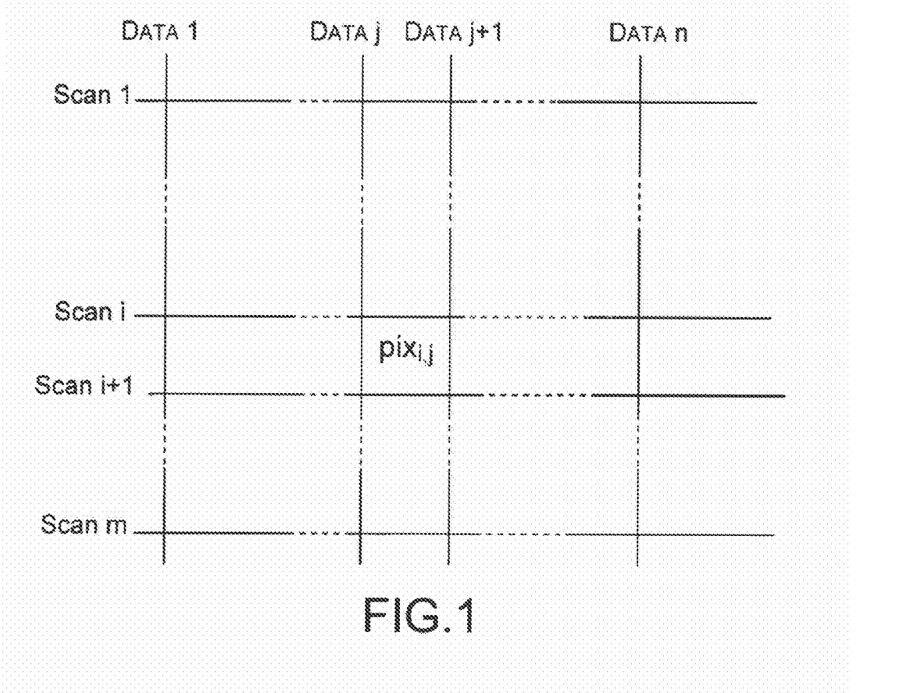
FIG. 1 illustrates schematically an OLED active matrix structure according to the prior art.

As illustrated schematically in FIG. 1, an active matrix of an AMOLED display screen usually comprises n×m pixels $pix_{i,j}$, where i=1 to m and j=1 to n, m row select lines Scan i and n columns DATA j allowing n pixels of the display screen to be addressed. For example, the pixel $pix_{i,j}$ may be controlled so as to display video information by means of the column DATA j, via which a voltage corresponding to the video information to be displayed is applied, and a row select line Scan i.

The invention concerns particular current control structures for a pixel which make it possible to solve the known problem of display degradation in AMOLED display screens due to the drift in threshold voltage of the current control transistors that drive the organic light-emitting diodes.

Figure 2:
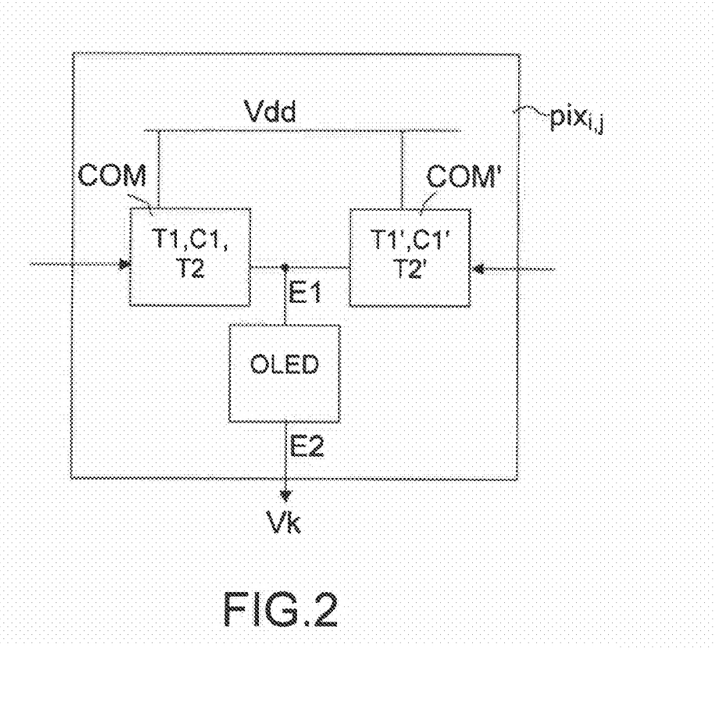
FIG. 2 is a diagram showing the principle of an OLED pixel of a matrix to which the invention applies.

These structures make it possible to provide a phase for recovering the drift in threshold voltage of the current control transistors for each pixel by means of a structure having two current drivers. More precisely, as shown in FIG. 2, each pixel $pix_{i,j}$ comprises a structure having two drivers COM and COM' for driving the organic diode OLED of the pixel. These two drivers COM and COM' each have an output that controls an electrode E1 of the OLED diode, which corresponds to the pixel electrode produced on the active matrix, whereas the other electrode E2 (cathode) of the diode, which corresponds to the counter-electrode, is connected to a potential Vk common to all the pixels.

The drivers COM and COM' have an identical structure, comprising at least: a switching transistor, a current control transistor and a sustain capacitor. By convention, T1, C1 and T2 denote these elements of the first referenced driver COM, and T1', C1' and T2' these elements of the second referenced driver COM'.

These drivers COM and COM' are controlled by row select lines and/or column data lines of the matrix in such a way that they have a different function at each video frame, these functions being periodically reversed. These functions are: 1) to display video information, by application of a video voltage to the gate of the current control transistor, so as to deliver a corresponding current to the OLED diode; and 2) to compensate for the stress occasioned by the first function, by application of a blocking voltage to the gate of the current control transistor.

Thus, during a given video frame, one of the two drivers, for example the driver COM, has the function of displaying the video information via the OLED diode, by application of a corresponding video voltage on the gate of its current control transistor T2, while the other driver, in the example COM', has the function of applying a blocking voltage to the gate of its current control transistor T2', thereby placing this transistor in threshold voltage drift recovery phase.

The functions of the two drivers are periodically reversed, so that one frame in two on average is used, for each driver, in order to destress its current control transistor. The average threshold voltage drift of each current control transistor of the active matrix is zero or approximately zero. This may be obtained without affecting the duty cycle for applying the video voltage to the OLED diode, so that the diode remains continually controlled (100% duty cycle).

To control the two drivers COM and COM' appropriately, as indicated above, rows and/or columns of the matrix are used, with, where appropriate, additional rows or columns especially provided, depending on the structure of the drivers. More precisely, a first embodiment has a control structure based on four transistors, two per driver COM, COM' (namely a switching transistor T1, T1' and a current control transistor T2, T2') and additional rows or columns are inserted into the matrix in order to drive them appropriately. Another embodiment has a control structure based on six transistors, three per driver COM, COM' (namely two switching transistors and one current control transistor) and row select lines for the preceding and following pixels of the matrix are used in addition to the usual row select line and column line for driving the transistors of the drivers COM and COM' appropriately.

One technical problem that arises in the invention is how to increase the number of transistors per pixel and/or the number of rows or columns needed to control each pixel, while still obtaining an open aperture ratio for a given pixel size (and therefore active matrix size) and an optimum manufacturing yield.

SUMMARY OF THE INVENTION

One solution provided by the invention to this technical problem is a particular arrangement of the elements for controlling the pixel and an optimized topology of the active matrix corresponding to these structures for controlling the OLED pixels with the desired functionalities, and in particular a topology of an active matrix for an AMOLED display screen based on 4 or 6 TFT transistors per pixel electrode.

The invention therefore relates to an active matrix for an organic light-emitting diode display screen, comprising pixels arranged in rows and in columns, each comprising a pixel electrode capable of accommodating an organic light-emitting diode on the surface and first and second current drivers connected to said pixel electrode, each first driver and each second driver comprising a current control transistor connected between a supply voltage Vdd and said pixel electrode and at least a first switching transistor for controlling the gate of said current control transistor, said first switching transistor being connected between a column data line of the matrix and the gate of said current control transistor, and having its gate connected to a row select line of the matrix, the source or drain electrodes of the switching and control transistors and the pixel electrodes being produced on a source-drain metal level, and the gate electrodes of these transistors each being produced by a row select line of the matrix, on a gate metal level, characterized in that:

each pixel is placed between two row select lines of the matrix, with a driver placed between a first of these two row select lines and its pixel electrode, said first row select line forming the gate of the first switching transistor of this driver and the other driver placed between a second of these two row select lines and the pixel electrode, said second row select line forming the gate of the first switching transistor of this driver;

a source-drain electrode of the control transistors is formed by a supply bus Vdd produced on the source-drain metal level, and the other source-drain electrode of the control transistors is formed by at least one finger, which is an excrescence of the pixel electrode on the same source-drain metal level; and     each column data line is placed between two columns of pixels of the matrix and formed by using said source-drain metal level and said gate metal level, said gate metal level being used along the pixel electrodes and said source-drain metal level being used in the zones between said pixel electrodes where the switching transistors of said drivers are produced.

In one embodiment, for a matrix in which the drivers comprise a second switching transistor connected between the row select line, to which the gate of the first switching transistor of the relevant driver is connected, and the gate of said control transistor, and the gate of which is connected to another row select line, each row select line is divided in the active zone into a first branch and a second branch placed on either side of a corresponding row of pixels.

The invention applies to organic light-emitting diode display screens comprising an active matrix according to the invention.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention.

Accordingly, the drawings and description thereof are to be regarded as illustrative in nature, and not as restrictive.

DESCRIPTION OF THE PREFERRED EMBODIMENT

In the following description, three current control structures having two drivers COM and COM' are presented and, for each structure, an arrangement of the pixel and a corresponding implementation of the active maxtrix, according to the invention, will be explained.

For the sake of clarity and simplification of the presentation, the elements common to the various figures bear the same references.

The row select lines that control the gates of the switching transistors are called Scan i or Scan i'. The prime symbol means that the line is provided in the matrix in addition to the usual row select line.

The column data lines via which the video or blocking voltages are transmitted to the switching transistors are called DATA j or DATA j'. The prime symbol indicates that the line is provided in the matrix in addition to the usual column data line.

The two electrodes on either side of the channel of a transistor Tk are both called source-drain electrodes, their functions not being different. These two electrodes are denoted as $ek_{sd}$ and $ek'_{sd}$.

Figure 3:
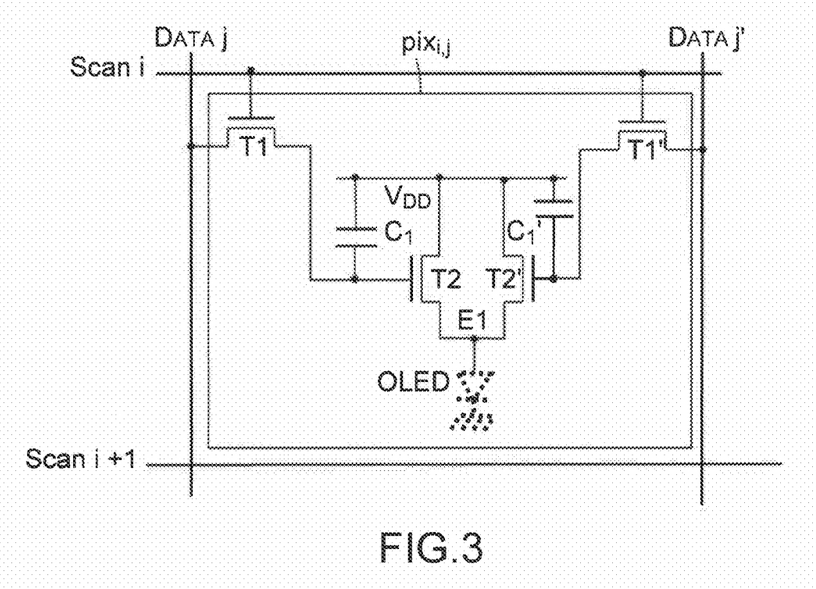
FIG. 3 illustrates an equivalent circuit diagram of a first OLED diode pixel structure.
Figure 6:
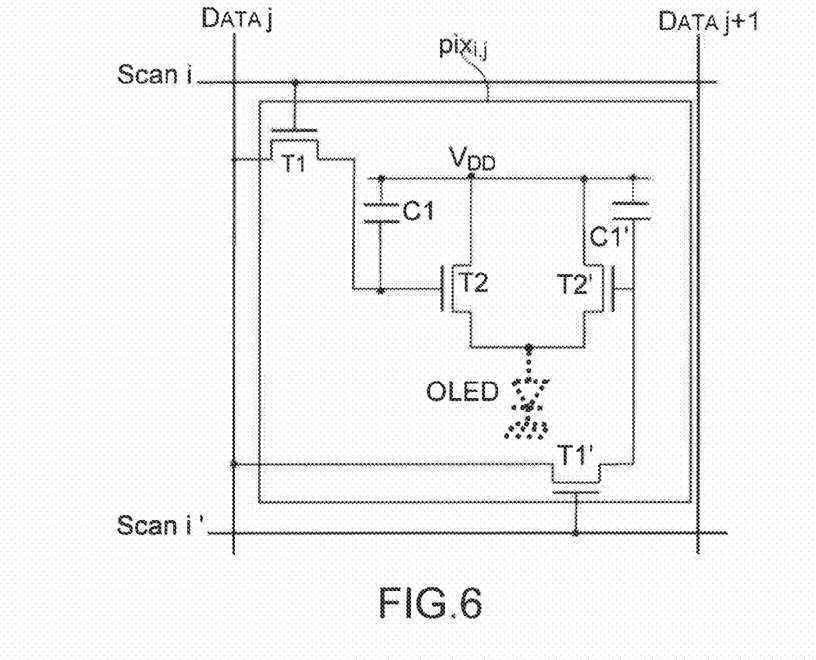
FIG. 6 illustrates an equivalent circuit diagram of a second OLED diode pixel structure.

FIGS. 3 and 6 are two examples of a circuit diagram for a control structure based on four transistors, namely two per driver COM, COM'. In this case, each driver comprises two transistors, namely a switching transistor T1, T1' and a current control transistor T2, T2'. The switching transistor (T1, T1') is connected between a column data line and the gate of the control transistor (T2, T2') and its gate is connected to a row select line, making it possible to apply a control (video or blocking) voltage to the gate of the control transistor (T2, T2') when the pixel is selected. The control transistor (T2, T2') is connected as a current generator between a supply voltage Vdd and the control electrode E1 of the OLED diode. The sustain capacitor (C1, C1') is connected between the gate of the control transistor and the supply voltage Vdd. It should be noted that various ways of connecting the sustain capacitor exist. For example, the sustain capacitor of one of the drivers could be connected to the row select line that controls the gate of the switching transistor of the other driver (not illustrated).

The difference between the two structures stems from the way in which the switching transistors T1 and T1' are addressed for alternately controlling the display function or the recovery function on the associated drivers COM and COM'.

Figure 4:
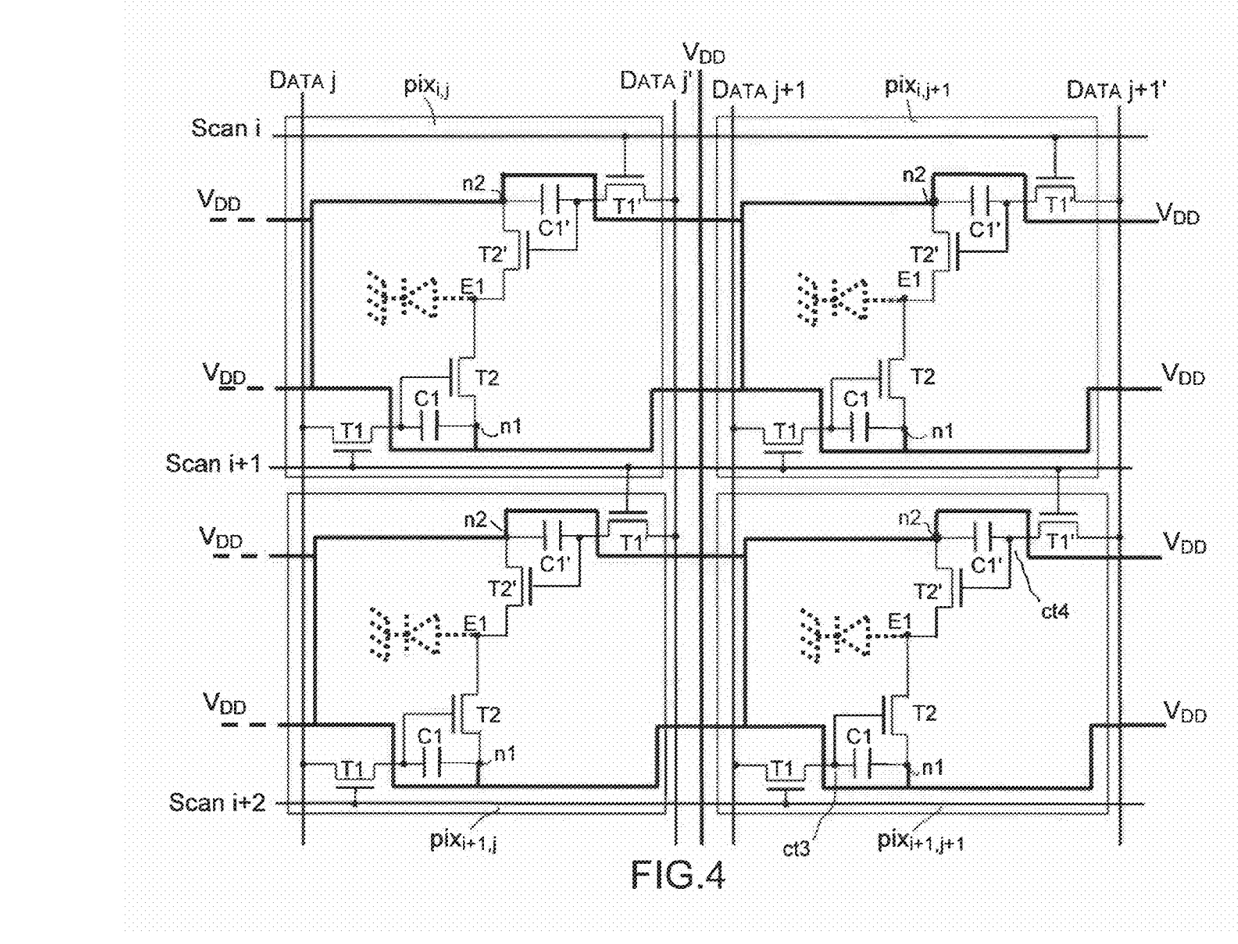
FIGS. 4 and 5 illustrate a corresponding implementation according to the invention.

FIG. 3 is a basic circuit diagram that illustrates a first way of implementing this addressing. FIG. 4 is a circuit diagram corresponding to the implementation of a pixel corresponding to the invention and FIG. 5 shows a topological implementation of a corresponding active matrix.

In this first embodiment, two column data lines per pixel are provided, and the alternating control in video display mode and recovery phase of the two switching transistors of a pixel $pix_{i,j}$ uses two column data lines DATA j and DATA j' associated with the pixel, each column data line receiving alternately a video voltage and a blocking voltage, the gates of the switching transistors T1 and T1' being driven by the row select line Scan i of the pixel. The first column data line DATA j is connected to the drain or to the source of the switching transistor T1 while the second column data line DATA j' is connected to the switching transistor T1'. A corresponding matrix of n columns x m rows of pixels therefore requires 2n column data lines—two per column—and m row select lines for addressing it, i.e. n additional columns compared with a standard matrix. Moreover, it comprises two 2-transistor drivers each per pixel.

Figure 5:
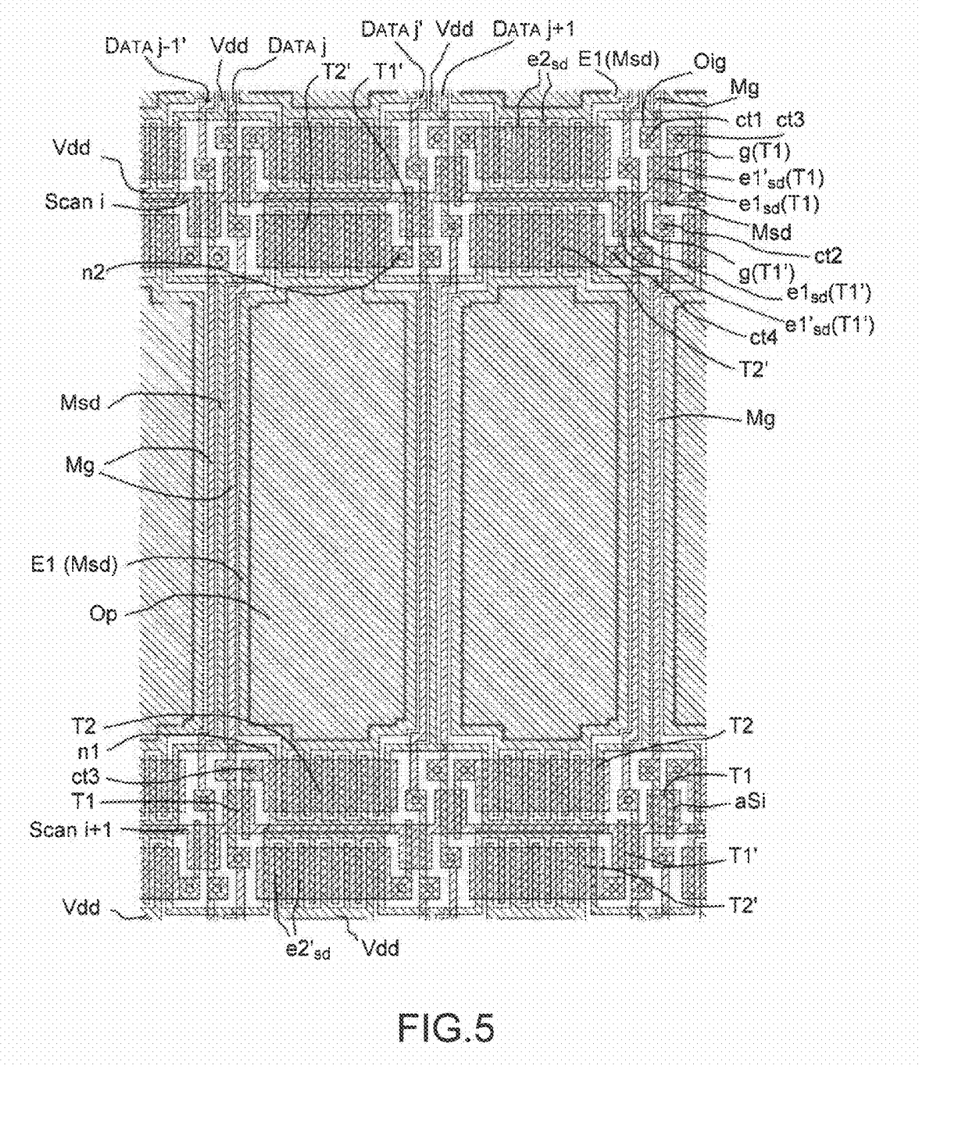

In an arrangement according to the invention, each pixel $pix_{i,j}$ is placed between two row select lines Scan i and Scan i+1 as demonstrated in the circuit diagram of FIG. 4 and the topological diagram of FIG. 5, with a symmetrical arrangement of the drivers COM and COM'. This arrangement is facilitated by modifying the control of the switching transistor T1 and T1' compared with the diagram shown in FIG. 3. These transistors are controlled by two different row select lines of the display screen, namely Scan i and Scan i+1, rather than by the same line. In the example, the gate of the switching transistor T1' is driven by the row select line Scan i while the gate of the switching transistor T1 is controlled by the row select line Scan i+1.

Advantageously, this arrangement has:
- a symmetry of the topology within the pixel $pix_{i,j}$ with respect to the pixel electrode E1, each driver located as close as possible to the row select line that drives it, in the example, Scan i in the case of the driver COM' and Scan i+1 in the case of the driver COM;
- symmetrical positioning of the transistors T2 of the pixels of one row relative to the transistors T2' (and vice versa) of the pixels of the following (or preceding) row relative to the row select line between the two rows. In the example, the transistors T2 are positioned above each row select line and the transistors T2' are positioned below it; and
- a back-to-back arrangement on either side of a row select line of the first switching transistor of the first driver for one pixel with the first switching transistor of a second driver for another pixel. Thus, there are pairs of transistors T1, T1' placed back-to-back with respect to a common row select line that drives these two transistors T1 and T1', such as for example the pair formed by the transistor T1 of the pixel $pix_{i+1,j}$ and the transistor T1' of the pixel $pix_{i,j+1}$, as may be seen in FIG. 4, and demonstrated in the bottom-right part of the topological diagram in FIG. 5. This back-to-back positioning with respect to a row select line makes it possible to optimize the space and therefore to increase the open aperture ratio. This is because the row select lines that are usually produced from gate metal Mg (typically TiMo, i.e. titanium molybdenum) have a suitable design (FIG. 5) so as to form the gates g of the switching transistors T1 and T1'. Furthermore, a source electrode of these transistors is formed by the associated column data line, without having to provide an excrescence of this line. The space is best optimized.

Figure 13:
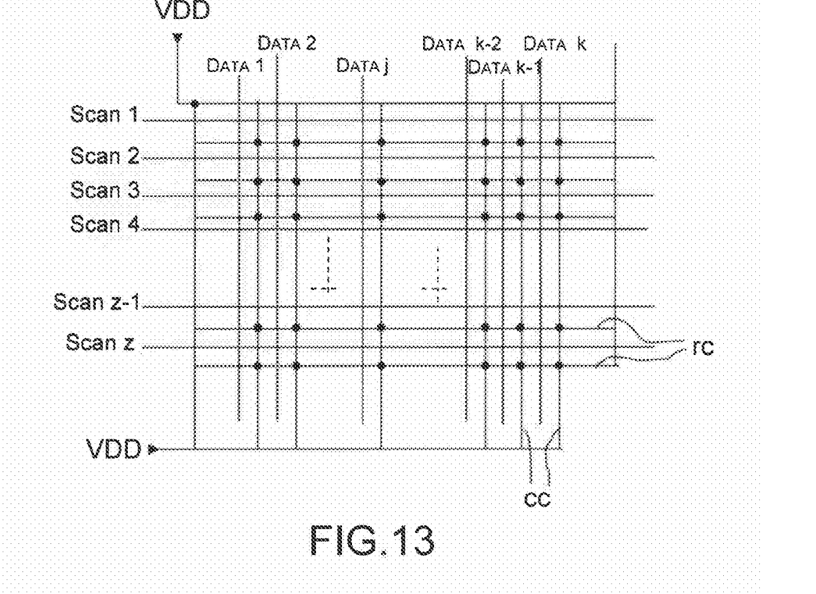
FIG. 13 illustrates the matrixed distribution of the voltage Vdd applicable in particular to FIGS. 3 to 8 and FIG. 14 illustrates the distribution of the voltage Vdd that applies more particularly to FIGS. 9 to 12.

The supply Vdd is advantageously distributed over the matrix not only in columns (or only in rows) but over a matrixed arrangement of row conductors and column conductors rc and cc in electrical continuity, as illustrated in FIG. 13, which makes it possible to deliver Vdd to the source/drain electrodes of the current control transistors T2 and T2' at the nodes n1 and n2 which each also correspond to the common node between the current control transistor and the sustain capacitor of the corresponding driver. This distribution of the supply Vdd is accomplished without encroaching on the zone of the pixel electrode E1 in which the OLED diode is produced. With such a matrixed distribution of the supply bus Vdd, the access resistance is low and substantially the same for all the pixels. The matrixed distribution advantageously provides a redundancy function, so that the manufacturing yield of the matrix is much better: matrixed distribution ensures that the current is distributed for all the pixels of the active zone even in the event of breaks that may occur in the supply columns or rows in the fabrication process. Matrixed distribution makes it possible to reach all the nodes for connection to Vdd (n1, n2) of the matrix, while still optimizing the optical area available at each pixel.

The supply bus Vdd is typically produced on the source-drain metal level Msd of the matrix (typically made of molybdenum (Mo)). It thus naturally produces a source-drain electrode of the transistors T2 and T2' by extending laterally along the rows on either side of each supply column Vdd, thus forming the matrix arrangement.

The source-drain metal level is also usually that of the column data lines DATA j, DATA j', that thus form of course in the source-drain electrodes of the switching transistors T1, T1', for example the electrode $e1_{sd}$ of the transistor T1 (FIG. 5).

Between two columns of pixels there are thus three vertical conductors, namely one supply column conductor Vdd and two column data line conductors, for example DATA j' and DATA j+1, placed on either side of it.

Both to limit the risks of a short circuit on the source-drain metal level between the coplanar column conductors and to produce these various column conductors close together, in order to increase the open aperture ratio, the column data lines are advantageously produced using a knitting method between two metal levels of the matrix, i.e. by using the source-drain metal level and the gate metal level, and by providing contact point(s) between them: the source-drain metal level Msd is used only in the geographical zone of the transistors, to produce source/drain electrodes $e1_{sd}$ of the switching transistors T1 and T1'. The gate metal level Mg is used everywhere else, and especially along the pixel electrodes E1, thereby having the supply column Vdd and the column data lines on either side of it very close together. In respect of the column data lines, the passage between the two metal levels Msd and Mg is typically formed by means of contact points ct1, ct2 obtained by an aperture Oig in the gate insulation layer, allowing the source-drain metal level Msd to come into contact at these points with the gate metal level.

The other source-drain electrode $e1'_{sd}$ of the switching transistors T1, T1', made of source-drain metal, is connected to the gate of the associated current control transistor T2 or T'2 by providing an aperture in the gate insulation for making the contact (ct3).

The matrixed distribution of the supply bus Vdd prevents passage of a source-drain metal conductor Msd in the zone between the two contact points ct1 and ct2: the column conductor Vdd made of source-drain metal Msd is divided on each side into supply line conductors before ct1, in order to form on each side the source-drain electrodes $e2_{sd}$ and $e2'_{sd}$ of the transistors T2 and T2' that face each other symmetrically with respect to the row select line, and join up on the other side after ct2. In other words, the matrixed distribution Vdd is produced so as to bypass each of the pairs of back-to-back transistors T1 and T1'. In this way, the optical aperture is optimized without in any way sacrificing the reliability of the fabrication process and the fabrication yield.

The pixel electrode E1 is typically produced on the source-drain metal level Msd (FIG. 5). An aperture Op is made in the passivation layer of the matrix in order to expose a contact zone on this electrode E1, that is to say the optical zone of the pixel on which the organic light-emitting diode will be placed.

To optimize the area occupied by the current control transistors, which must have a width W of the channel of large enough size to provide the current needed for the OLED diodes, these transistors T2, T2' advantageously have what is called a topology with interdigitated source-drain electrodes, as illustrated in FIG. 5, thereby making it possible to obtain the desired ratio over a minimum width (considering the width in the direction of the row select lines), and therefore without degrading the open aperture ratio of the pixel. More precisely, a source-drain electrode $e2_{sd}$ of these transistors is formed by excrescenses (fingers) of the pixel electrode E1 (source-drain metal Msd), whereas the other source-drain electrode $e2'_{sd}$ is formed by excrescenses from the supply bus Vdd. The symmetrical positioning of the two transistors T2 and T2' with respect to each row select line makes it possible to produce a corresponding electrode $e2_{sd}$ in each of these two transistors from the same portion of supply line conductor Vdd. It will be noted that at this point the supply conductor Vdd (made of Msd metal) is located on the row select line made of gate metal Mg, so that there is optimum management of the occupied space. Furthermore, this implementation with a plurality of electrode fingers makes it possible to limit pixel defect problems in the event of a break at a finger, compared with implementations having single fingers.

Between two pixel columns there are thus two column data line conductors, for example DATA j' and DATA j+1 flanking, on each side, a supply column conductor Vdd.

The arrangement according to the invention makes it possible in particular to optimize the area occupied by a four-transistor pixel, with an advantageous open aperture ratio.

The transistors are typically TFTs (thin-film transistors) preferably made of amorphous silicon: the channel of these transistors is made of amorphous silicon a-Si, between the source-drain electrodes (Msd level), and controlled by the gate (on the Mg level) more particularly as shown on one of the transistors in FIG. 5.

Figure 7:
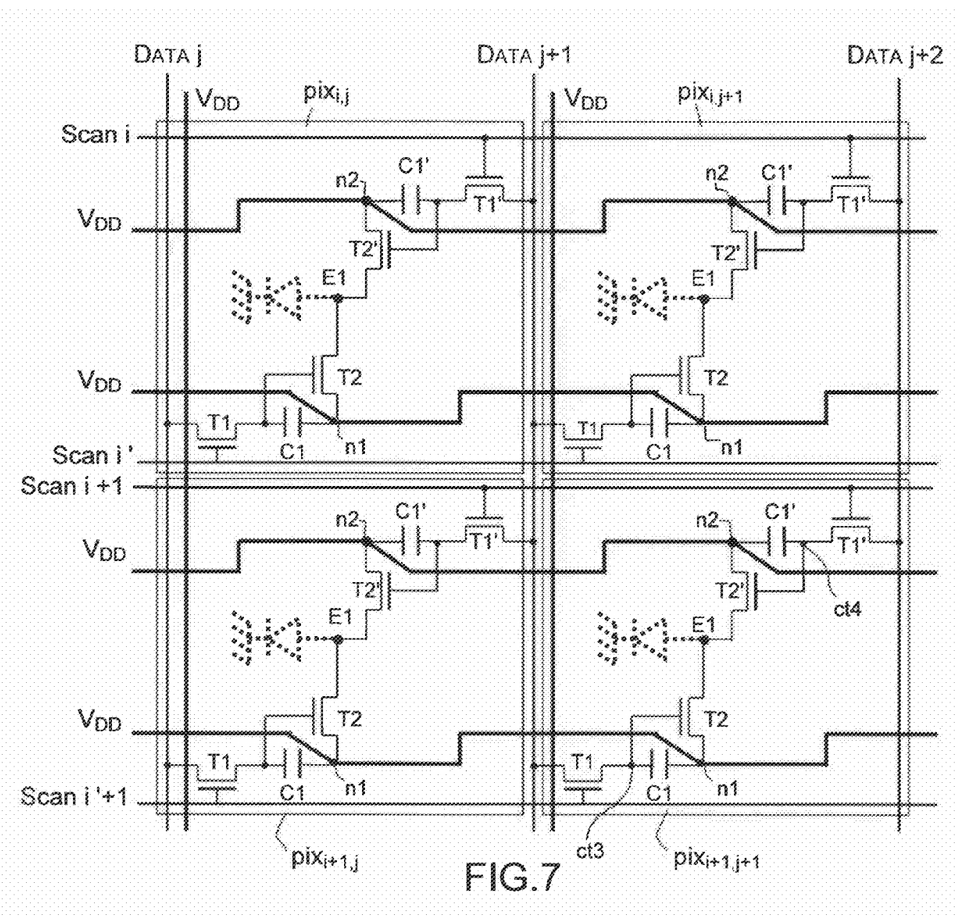
FIGS. 7 and 8 illustrate a corresponding implementation according to the invention.
Figure 8:
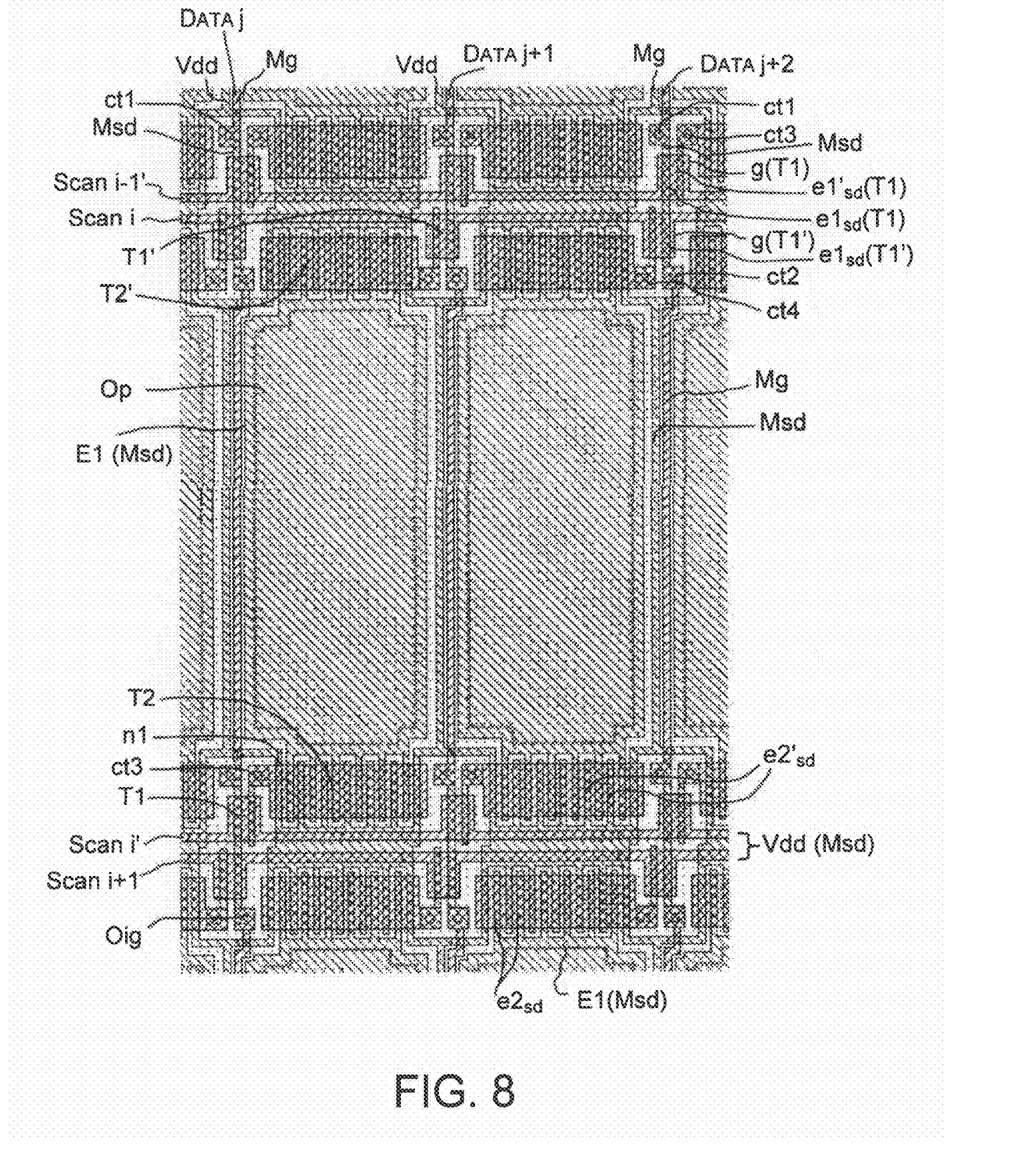

FIG. 6 is a basic circuit diagram illustrating another method of addressing the switching transistors T1 and T1' of a four-transistor control structure for controlling, alternately, the display function or the recovery function on the associated drivers COM and COM'. FIG. 7 is a circuit diagram corresponding to an implementation of a corresponding pixel according to the invention and FIG. 8 shows a topological implementation of a corresponding active matrix.

Instead of inserting additional column data lines in order to allow the alternation of the display and recovery functions of the drivers COM and COM' as in FIG. 3, row select lines are used. Instead of doubling the number of column data lines, the number of row select lines is doubled. A corresponding matrix will therefore comprise 2·m row select lines—two per pixel—and n column data lines associated with m·n pixels $pix_{i,j}$ of the display screen.

In this embodiment, the gate of the switching transistor T1 is connected to the row select line Scan i of the pixel $pix_{i,j}$, and the gate of the dual switching transistor T1' is connected to another row select line, which is denoted by Scan i'. As illustrated in FIG. 8, the same column data line, for example DATA j+2, is connected to a source-drain electrode $e1_{sd}$ of all the transistors T1 of the pixels of the column to the right of this line and to a source-drain electrode $e1'_{sd}$ of all the transistors T1' of the pixels of the column to the left of this line.

From the standpoint of the arrangement and the topology of the matrix, everything described above in relation to FIGS. 3 to 6 applies in the same way, since in both cases each pixel is flanked by two row select lines which each control one of the switching transistors (T1, T1') of this pixel, but the necessary space for producing the pixels is greater here, since there is only one supply conductor and one column data line between two columns of pixels.

Furthermore, the back-to-back positioning of the two transistors T1 and T1' associated with the same column data line and with the same row select line therefore makes it possible to produce the source-drain electrode $e1_{sd}$ for these two transistors T1 and T1' with the same column data line conductor, that is to say the part of the source-drain metal Msd between the two contacts ct1 and ct2 without having to adapt the design thereof. The space is thus best optimized.

Figure 9:
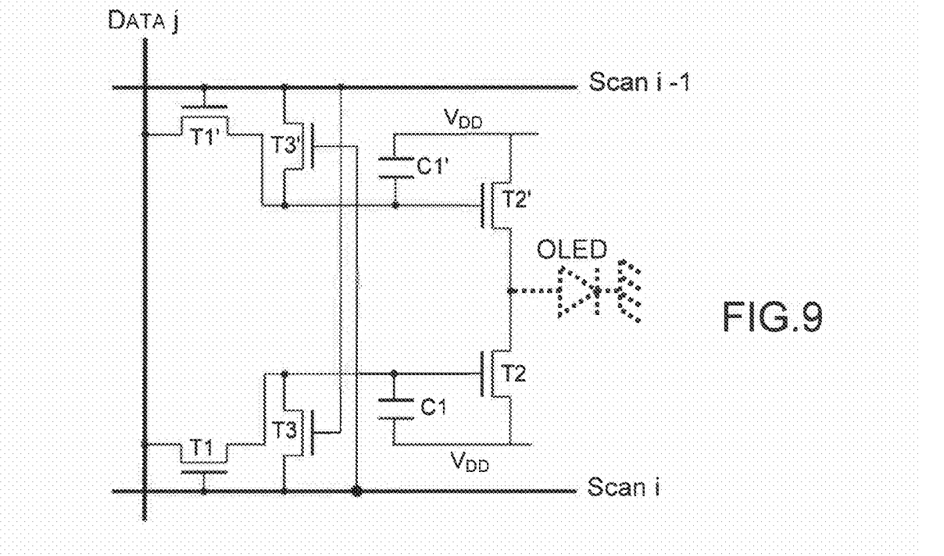
FIG. 9 illustrates a third OLED diode pixel structure according to another embodiment of the invention.

FIG. 9 illustrates a diagram showing the principle of an OLED pixel with a control structure based on six transistors, namely three per driver COM. The advantage of such a structure is that it does not require additional row select or column data lines to control the alternating recovery and video display functions on the drivers COM and COM'. For a screen consisting of n×m pixels, there are therefore m row select lines Scan i and n column data lines DATA j as in the prior art (FIG. 1).

This is a precious advantage in terms of circuit topology (intersection of lines, control of the lines) and the space occupied. This is achieved by providing an additional switching transistor by means of which the current control transistors are alternately controlled. This additional driver switching transistor is denoted by T3 in the case of the driver COM and T3' in the case of the driver COM'. In what follows, the transistors T1 and T1' are referred to as first switching transistors and the transistors T3 and T3' are referred to as second switching transistors.

As illustrated in FIGS. 8 and 9, for each pixel $pix_{i,j}$ there is a single column data line DATA j that is connected to the first switching transistors T1 and T1' of the two drivers COM and COM', a first row select line, to which the gate of the first switching transistor of one of the drivers is connected, and another row select line of the matrix, preferably the previous line, to which the gate of the first switching transistor of the other driver is connected. In the example, in the case of the pixel $pix_{i,j}$, the row select line Scan i is connected to the gate of the switching transistor T1 of the driver COM, while the row select line Scan i−1 is connected to the gate of the switching transistor T1' of the driver COM'. The components T1, C1 and T2 of the driver COM and T1', C1' and T2' of the driver COM' are also connected together and to the OLED diode as indicated previously, especially in relation to FIG. 3. As previously, n1 and n2 respectively denote the node for connection of a source-drain electrode of the transistor T2 and T2' respectively to Vdd, while ct3 and ct4, respectively, denote the node for connection of a source-drain electrode of the first switching transistor T1 and T1', respectively, to the gate of the control transistor T2 and T2' respectively.

The second switching transistor T3, T3' provided in each driver is connected between the gate of the current control transistor and the row select line Scan i, Scan i−1 respectively of the first switching transistor of the driver to which it belongs. The gate of the second switching transistor of a driver is connected to the row select line associated with the other driver. In the example illustrated, the transistor T3 of the pixel $pix_{i,j}$ is thus connected between the row select line Scan i of the switching transistor T1 and the gate of the current control transistor T2. Furthermore, its gate is connected to the row select line Scan i−1 . The transistor T3' is connected between the row select line Scan i−1 of the switching transistor T1' and the gate of the current control transistor T2'. Furthermore, its gate is connected to the row select line Scan i.

According to the invention, a corresponding pixel arrangement is provided so as to best optimize the space, while still taking into account the technological constraints. In particular, as already indicated above, the aim is to arrange the drivers COM and COM' symmetrically within the pixel so as to obtain an optimum open aperture ratio. It is particularly advantageous to be able to arrange the switching transistors back-to-back, making it possible to limit the necessary space and make the connections easier. It is also advantageous to be able to arrange the current control transistors symmetrically relative to the row select lines.

Figure 10:
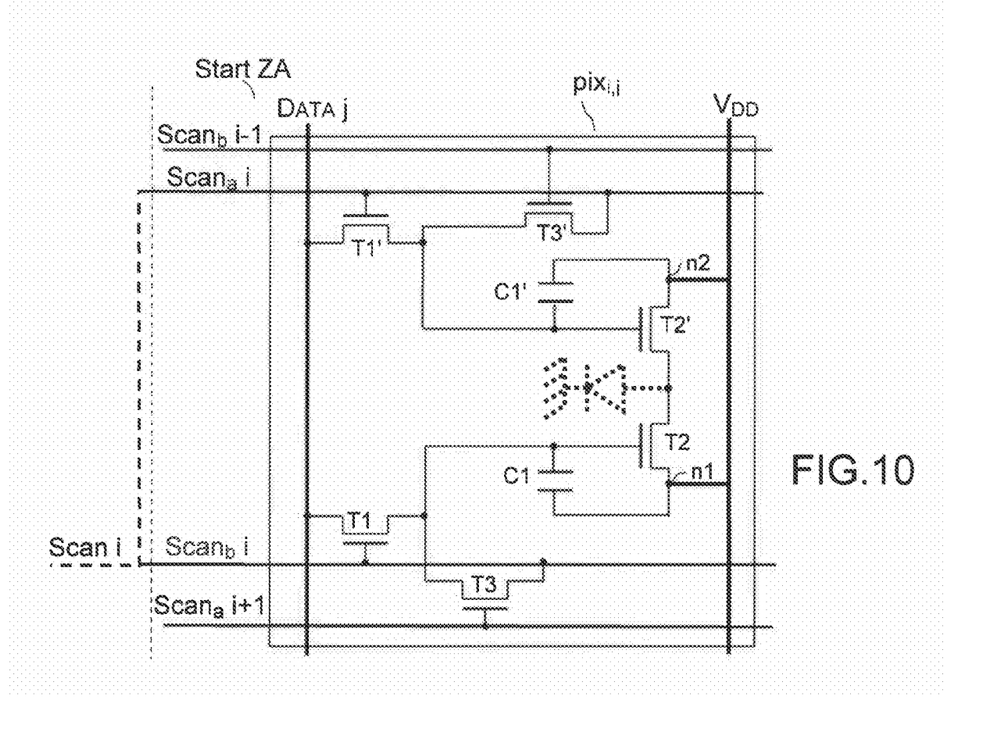
FIGS. 10 to 12 illustrate a corresponding implementation according to the invention.
Figure 11:
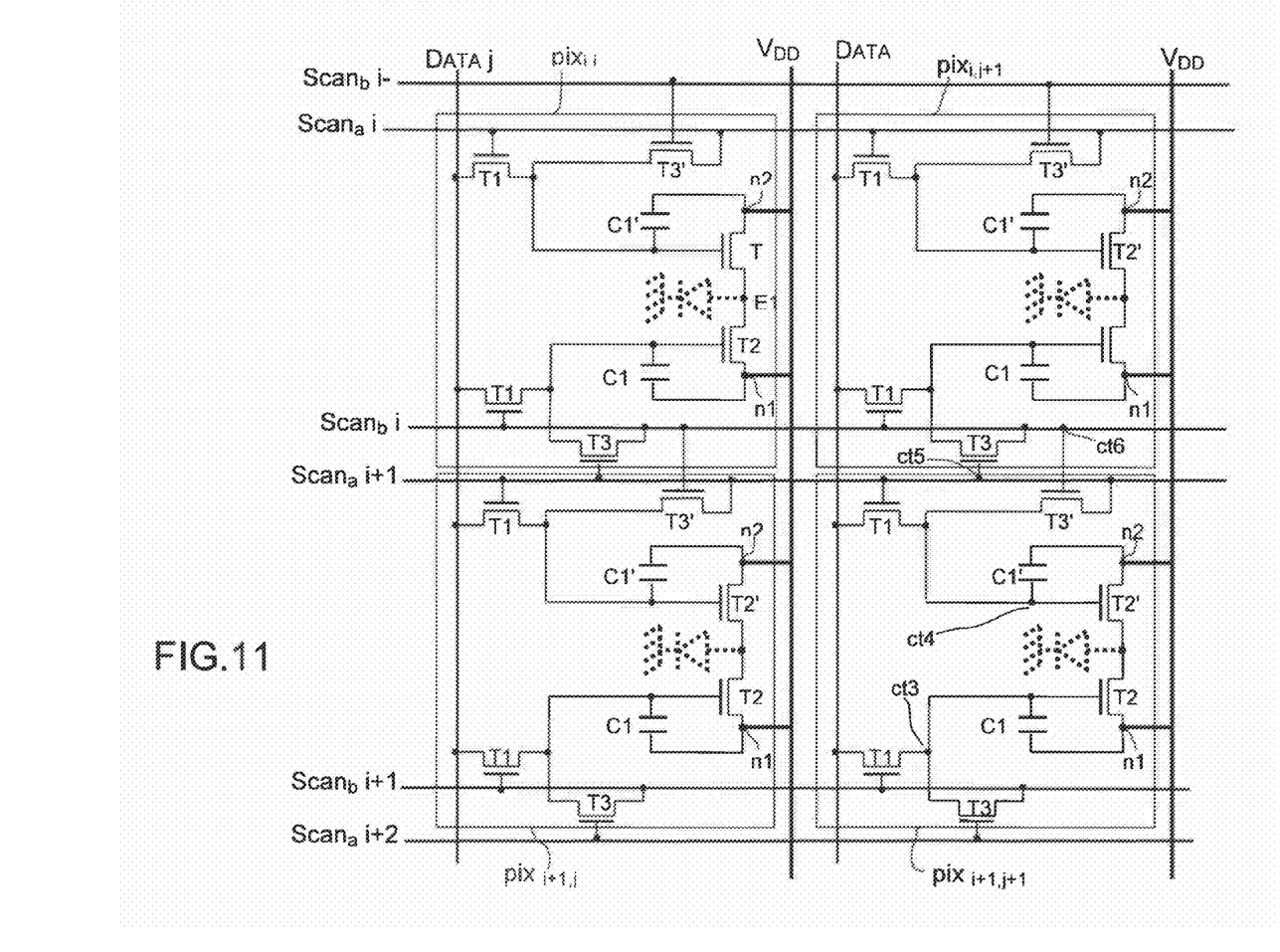
Figure 12:
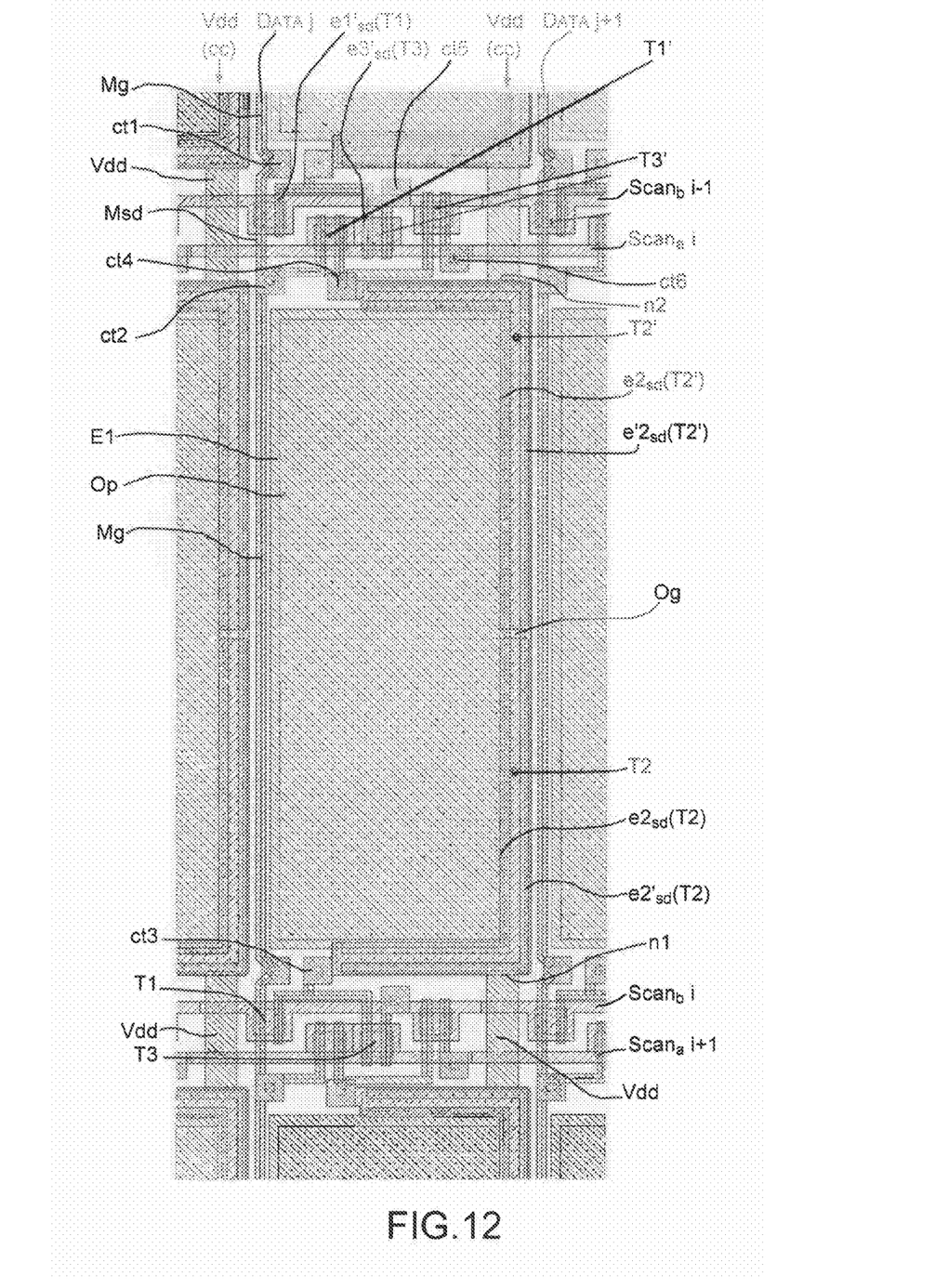

A corresponding arrangement according to the invention is illustrated in FIGS. 10, 11 and 12. FIGS. 10 and 11 are circuit diagrams for a pixel (FIG. 10) and for four adjacent pixels (FIG. 11). FIG. 12 is a topological diagram of a corresponding matrix.

In this arrangement, a doubling of the row select lines is provided so that there are two branches Scan$_a$ i and Scan$_b$ i of a row select line Scan i on either side of the optical area. Each pixel is thus flanked by two row select lines, which are the top and bottom branches Scan$_a$ i and Scan$_b$ i of the same row select line. This arrangement allows the switching transistors of the pixel to be favourably implemented without crossing over the pixel. It also allows the two drivers COM and COM' of the pixel to be arranged symmetrically on either side of the pixel electrode E1. In practice, the doubling of the lines is provided on the boundary of the active zone AZ.

The current control transistors T2 and T2' of a pixel are placed alongside the pixel electrode, between the pixel electrode E1, which forms a source-drain electrode e2$_{sd}$ of these transistors, and a supply column Vdd, which forms the other electrode e2'$_{sd}$ thereof. Here, the transistors are an L, with a single source-drain electrode finger. The width W of the channel, which has to be large for these transistors, is obtained here by exploiting the length of the pixel electrode E1. The separation between the two transistors T2 and T2' is obtained by a separation Og between the two gates g of these transistors.

Figure 14:
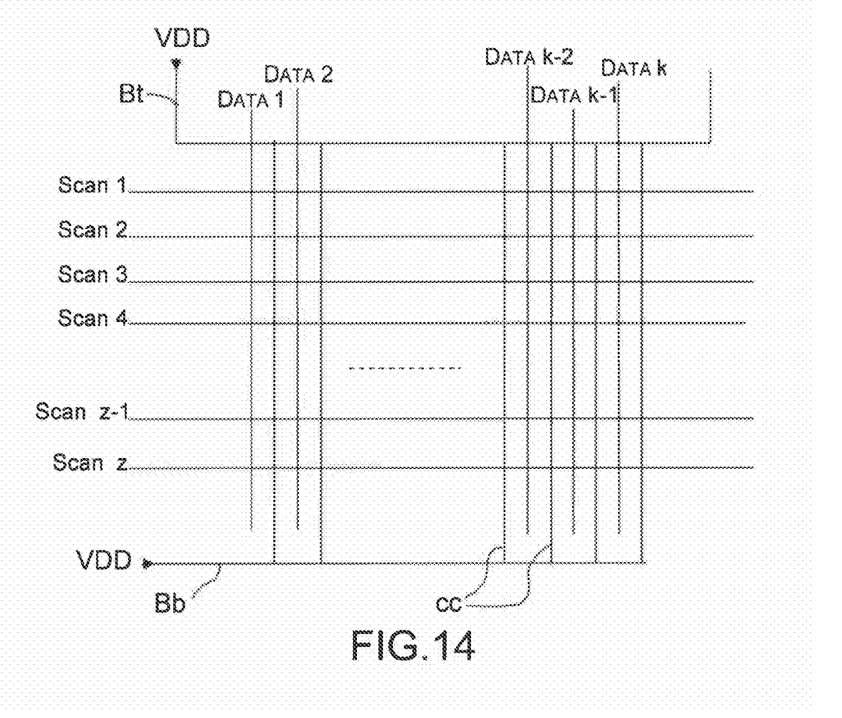

The supply bus Vdd is distributed via supply column conductors cc coming from a top main bus Bt or bottom main bus Bb, as illustrated in FIG. 14. There is thus one supply column conductor cc for each column of pixels, which is placed in each interval between two columns of pixels (FIG. 12). Indeed, a matrixed distribution as in FIG. 13 is not advantageous in the case of the six-transistor control structure. To limit the voltage drop between the supply column conductors c$_c$ because of the current consumption in the pixels, broad supply column conductors are produced, as may be seen in FIG. 12, so as to obtain the lowest possible access resistance.

Apart from these differences, associated with the presence of one additional switching transistor per driver, the other features of an arrangement according to the invention, seen in relation with the previous embodiments for four-transistor control structures, apply in the same way with the same effects. In particular, there is again knitting with the contact points ct1 and ct2. The switching transistors are concentrated between two successive row select lines, mainly between the bottom branch of a row select line, for example Scan$_b$ i, and the top branch of the following row select line, in the example Scan$_a$ i+1. This arrangement makes it possible to optimize the various connections to be produced, especially the connections connecting, in common, the source-drain electrodes of the switching transistors of a driver to the gate of the current control transistor: there is thus one point of contact ct3 for connecting the source-drain electrode e'1$_{sd}$ of the transistor T1 and the source-drain electrode e'3$_{sd}$ of the transistor T3 to the gate of the transistor T2 and one point of contact ct4 for connecting the source-drain electrode e'1$_{sd}$ of the transistor T1' and the source-drain electrode e'3$_{sd}$ of the transistor T3' to the gate of the transistor T2'.

The points of contact ct1 and ct2 also serve for connecting the source-drain electrode e1$_{sd}$ of the transistor T1' to the column data line associated with the corresponding pixel, which forms the source-drain electrode e1$_{sd}$ of the transistor T1 of the previous pixel in the column.

A point of contact ct5, ct6 respectively allows the electrode e3$_{sd}$ of the transistor T3, T3' respectively to be connected to the corresponding row select line.

The various examples of arrangements that have just been given for illustrating the invention show that, by arranging each pixel between two row select lines that drive the switching transistors of this pixel (in the first example, Scan i and Scan i', and in the second example, Scan$_a$ i and Scan$_b$ i), it is possible to arrange the two drivers symmetrically, on either side of the pixel electrode, between the pixel electrode and the row select line that drives the switching transistor or transistors of the driver in question, and that the knitting of the column data lines between the conductor level of the source-drain electrodes of the transistors and the gate conductor level of the transistors makes it possible to produce an active matrix with a maximized optical aperture and optimum fabrication reliability (no risks of short circuits due to excess metal between coplanar conductors).

The back-to-back arrangement of the switching transistors driven by the same row select line advantageously increases the optical aperture.

In the examples illustrated, the sustain capacitors C1 and C1' are typically produced by the gate-source (or gate-drain) capacitances of the current control transistors.

The matrixed distribution of the supply bus (FIG. 13) that may advantageously be employed in the case in which the drivers comprise a single switching transistor makes it possible to improve the access resistance and therefore to obtain better power distribution over the matrix, while still improving the reliability of the fabrication process (redundancy).

The invention that has just been described applies most particularly to organic light-emitting diode display screens using an active matrix based on TFT (amorphous silicon) transistors. It applies more generally to any active-matrix organic light-emitting diode display screens.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by the definition contained in the appended claims and equivalent thereof.

The invention claimed is:

1. An active matrix for an organic light-emitting diode display screen, comprising:
    pixels arranged in rows and in columns, each pixel including,
        a pixel electrode capable of accommodating an organic light-emitting diode on the surface, and
        first and second current drivers connected to said pixel electrode, wherein the first and second current drivers each include,
            a current control transistor connected between a supply voltage Vdd and said pixel electrode, and
            at least a first switching transistor that controls a gate of said current control transistor, wherein said first switching transistor is connected between a column data line of the matrix and the gate of said current control transistor, a gate of the first switching transistor is connected to a row select line of the matrix, and source or drain electrodes of the first switching transistor and the current control transistor, and the pixel electrodes are disposed at a source-drain metal level, and the gate electrodes of the first switching transistor and the current control transistor are each disposed at a row select line of the matrix, on a gate metal level;

each pixel is disposed between two row select lines of the matrix, with the first current driver disposed between a first of these two row select lines and the pixel electrode, said first row select line forming the gate of the first switching transistor of the first current driver and the second current driver is disposed between a second of these two row select lines and the pixel electrode, said second row select line forming the gate of the first switching transistor of the second current driver;

a source-drain electrode of the current control transistors of the first and second current drivers is formed by a Vdd supply bus produced on the source-drain metal level, and the other source-drain electrode of the control transistors is formed by an excrescence of the pixel electrode on the source-drain metal level; and each column data line is disposed between two columns of pixels of the matrix and formed from said source-drain metal level and said gate metal level, said gate metal level being used along the pixel electrodes and said source-drain metal level being used in zones between said pixel electrodes where the first switching transistors of said first and second current drivers are disposed.

2. The matrix according to claim 1, wherein said supply voltage Vdd is distributed over the matrix by the Vdd supply bus with a row/column matrixed arrangement.

3. The matrix according to claim 2, wherein each area between two successive columns of pixels comprises the Vdd supply bus and at least one column data line conductor.

4. The matrix according to claim 2, wherein the first switching transistor of the first current driver for a first pixel and the first switching transistor of the second current driver for another pixel are placed back-to-back and on either side of a row select line.

5. The matrix according to claim 4, wherein each area between two successive columns of pixels comprises the Vdd supply bus column and a column data line conductor, and said first switching transistors placed back-to-back have a source-drain electrode formed by a portion of a source-drain metal column conductor of the column data line conductor.

6. The matrix according to claim 2, wherein the control transistor of the first current driver of a first pixel and the control transistor of the second current driver of a preceding or following pixel are arranged symmetrically on either side of a row select line.

7. The matrix according to claim 2, wherein the control transistors of said first and second current drivers have inter-digitated source-drain electrodes, each source-drain electrode comprising more than one finger.

8. The matrix according to claim 1, wherein each first current driver and each second current driver comprises a second switching transistor connected between the row select line, to which the gate of the first switching transistor of the first current driver and second current driver is connected, respectively, and the gate of said control transistor, and the gate of the second switching transistor is connected to another row select line, wherein each row select line is divided in an active zone into a first branch and a second branch placed on either side of a corresponding row of pixels.

9. The matrix according to claim 8, wherein the supply voltage Vdd is distributed by column conductors, with a supply column conductor in each area between two columns of pixels, and in which the control transistors of the first and second current drivers of a pixel are produced along the pixel electrode, between said pixel electrode and said supply column conductor which form, respectively, a first source-drain electrode and a second source-drain electrode of said control transistors.

10. A display screen comprising:

organic light-emitting diodes, each including an active matrix according to any one of the preceding claims.

* * * * *